United States Patent
Kim et al.

(10) Patent No.: US 9,922,724 B2
(45) Date of Patent: Mar. 20, 2018

(54) METHODS OF OPERATING BUFFERED MULTI-RANK MEMORY MODULES CONFIGURED TO SELECTIVELY LINK RANK CONTROL SIGNALS

(71) Applicant: Samsung Electronics Co., Ltd., Suwon-si, Gyeonggi-do (KR)

(72) Inventors: Tae-Hyung Kim, Seoul (KR); Huichong Shin, Seongnam-Si (KR); Seokil Kim, Hwaseong-Si (KR); Young Yun, Yongin-Si (KR); Jonghyoung Lim, Seoul (KR); Youkeun Han, Yongin-Si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/713,936

(22) Filed: Sep. 25, 2017

(65) Prior Publication Data
US 2018/0025788 A1 Jan. 25, 2018

Related U.S. Application Data

(62) Division of application No. 15/207,557, filed on Jul. 12, 2016, now Pat. No. 9,812,220.

(30) Foreign Application Priority Data

Sep. 25, 2015 (KR) ........................ 10-2015-0136181

(51) Int. Cl.
*G11C 7/10* (2006.01)
*G11C 29/34* (2006.01)
(Continued)

(52) U.S. Cl.
CPC ............ *G11C 29/34* (2013.01); *G06F 3/0613* (2013.01); *G06F 3/0647* (2013.01);
(Continued)

(58) Field of Classification Search
CPC ....................................................... G11C 7/10
(Continued)

(56) References Cited

U.S. PATENT DOCUMENTS 6,746,953 B2 6/2004 Kramer et al.
7,998,860 B2 8/2011 Li et al.
(Continued)

FOREIGN PATENT DOCUMENTS

JP 2001-160612 6/2001
JP 2011-066241 3/2011
(Continued)

*Primary Examiner* — Harry W Byrne
(74) *Attorney, Agent, or Firm* — Ward and Smith, P.A.

(57) ABSTRACT

A method of operating a memory module including a plurality of semiconductor memory devices organized into a multi-rank memory on a DIMM and a memory buffer included on the DIMM, operatively coupled to the multi-rank memory, can be provided by mapping an access to the DIMM from a memory controller to semiconductor memory devices included in more than one rank within the multi-rank memory based on a mode register set signal and selectively linking rank control signals during a parallel bit test operation to the more than one rank within the multi-rank memory plurality of semiconductor memory devices.

11 Claims, 12 Drawing Sheets

(51) Int. Cl.
*G06F 3/06* (2006.01)
*G06F 12/1009* (2016.01)
*G11C 11/4093* (2006.01)
*G11C 11/4076* (2006.01)
*G11C 5/04* (2006.01)

(52) U.S. Cl.
CPC .......... *G06F 3/0656* (2013.01); *G06F 3/0688* (2013.01); *G06F 12/1009* (2013.01); *G11C 7/109* (2013.01); *G11C 7/1045* (2013.01); *G06F 2212/1024* (2013.01); *G11C 5/04* (2013.01); *G11C 11/4076* (2013.01); *G11C 11/4093* (2013.01)

(58) Field of Classification Search
USPC ..................................... 365/189.011–189.12
See application file for complete search history.

(56) References Cited

U.S. PATENT DOCUMENTS

| | | | |
|---|---|---|---|
| 8,531,046 B2 | 9/2013 | Pratt et al. | |
| 8,576,637 B2* | 11/2013 | Jang | G11C 5/04 365/189.05 |
| 8,896,136 B2 | 11/2014 | Tsai et al. | |
| 8,928,159 B2 | 1/2015 | Chang et al. | |
| 2008/0080261 A1* | 4/2008 | Shaeffer | G11C 5/025 365/189.05 |
| 2009/0259895 A1 | 10/2009 | Jung | |
| 2010/0226185 A1* | 9/2010 | Lee | G11C 5/04 365/189.05 |
| 2011/0176371 A1* | 7/2011 | Jang | G11C 5/04 365/189.05 |
| 2012/0257461 A1 | 10/2012 | Kim et al. | |
| 2014/0372839 A1 | 12/2014 | Ok | |

FOREIGN PATENT DOCUMENTS

JP 2015-005690 1/2015
KR 1020140078156 6/2014

* cited by examiner

FIG. 6

| A7 | A6 | A5 | A4 | A3 | A2 | A1 | A0 | | Comment |
|---|---|---|---|---|---|---|---|---|---|
| X | X | X | X | X | X | 0 | 0 | CS | Normal Mode |
| X | X | X | X | X | X | 0 | 1 | | 4R → 2R |
| X | X | X | X | X | X | 1 | 0 | | 2R → 1R or 4R → 1R |
| X | X | X | X | X | X | 1 | 1 | | Reserved |
| X | X | X | X | X | 0 | X | X | CKE | Normal Mode |
| X | X | X | X | X | 1 | X | X | | DCKE0 → QCKE0 & QCKE1 |
| 0 | 0 | 0 | 0 | 0 | X | X | X | ODT | Normal Mode |
| 0 | 0 | 0 | 0 | 1 | X | X | X | | DODT1 → QODT0 & 1 |
| 0 | 0 | 0 | 1 | 0 | X | X | X | | DODT1 → QODT1 (QODT0 fix low) |
| 0 | 0 | 1 | 0 | 0 | X | X | X | | DODT1 → QODT1 (QODT0 fix high) |
| 0 | 1 | 0 | 0 | 0 | X | X | X | | DODT0 → QODT0 (QODT1 fix low) |
| 1 | 0 | 0 | 0 | 0 | X | X | X | | DODT0 → QODT0 (QODT1 fix high) |

FIG. 7

| A7 | A6 | A5 | A4 | A3 | A2 | A1 | A0 |  | Comment |
|----|----|----|----|----|----|----|----|---|---------|
| x | x | x | x | x | x | x | 0 | DCS0 | Input buffer enabled (Default) |
| x | x | x | x | x | x | x | 1 |  | Input buffer ignore, QCS0 – FIXH |
| x | x | x | x | x | x | 0 | x | DCS1 | Input buffer enabled (Default) |
| x | x | x | x | x | x | 1 | x |  | Input buffer ignore, QCS1 – FIXH |
| x | x | x | x | x | 0 | x | x | DCS2 | Input buffer enabled (Default) |
| x | x | x | x | x | 1 | x | x |  | Input buffer ignore, QCS2 – FIXH |
| x | x | x | x | 0 | x | x | x | DCS3 | Input buffer enabled (Default) |
| x | x | x | x | 1 | x | x | x |  | Input buffer ignore, QCS3 – FIXH |
| x | x | x | 0 | x | x | x | x | DCKE0 | Input buffer enabled (Default) |
| x | x | x | 1 | x | x | x | x |  | Input buffer ignore, QCKE0 – FIXH |
| x | x | 0 | x | x | x | x | x | DCKE1 | Input buffer enabled (Default) |
| x | x | 1 | x | x | x | x | x |  | Input buffer ignore, QCKE1 – FIXH |

METHODS OF OPERATING BUFFERED MULTI-RANK MEMORY MODULES CONFIGURED TO SELECTIVELY LINK RANK CONTROL SIGNALS

CROSS-REFERENCE TO RELATED APPLICATIONS

This application is a divisional application of U.S. patent application Ser. No. 15/207,557; filed Jul. 12, 2016 which claims the benefit of Korean Patent Application No. 10-2015-0136181 filed Sep. 25, 2015 in the Korean Intellectual Property Office, the entire contents of which are hereby incorporated by reference.

BACKGROUND

High-bandwidth memory (hereinafter referred to as "HBM") is a type of the memory structure in which a plurality of semiconductor memory chips may be stacked on a memory buffer chip (or a register) which performs logic circuit functions. In this case, the buffer memory chips and the semiconductor memory chips may be connected to each other by through silicon vias (TSV).

A plurality of semiconductor memory chips (e.g., dies or devices) can be mounted on a printed circuit board (PCB) to implemented a memory module. The dual in-line memory module (DIMM) type memory module may be classified as a registered dual in-line memory module (RDIMM), a load reduced dual in-line memory module (LRDIMM), or FRDIMM.

Semiconductor memory devices which constitute the memory module may be divided into two or more ranks. That is, in the case of a dual-rank structure, a plurality of semiconductor memory devices on a substrate of a memory module are classified into two ranks, and semiconductor memory devices in the same rank may be accessed at the same time. As a result, a rank may mean a unit written or read together by a memory controller. Thus, for example, in the case that a single rank has a 64-bit data transfer width, dual ranks may have twice the data transfer width of the single rank, and quad ranks may have four times a data transfer width of the single rank.

SUMMARY

In some embodiments, a memory module can include a plurality of semiconductor memory devices on a substrate to provide a dual in-line memory module (DIMM) organized into at least two ranks and a memory buffer, that is configured to change states of input signals received for each rank based on a mapping table defined according to a mode register set signal and configured to control the plurality of semiconductor memory devices for each rank.

In some embodiments, a memory module can include a plurality of semiconductor memory devices on a substrate to provide a DIMM organized into at least two ranks and a memory buffer configured to change states of input signals received for each rank based on a mapping table defined according to a mode register set signal and configured to control the plurality of semiconductor memory devices for each rank.

In some embodiments, a method of operating a memory module including a plurality of semiconductor memory devices organized into a multi-rank memory on a DIMM and a memory buffer included on the DIMM, operatively coupled to the multi-rank memory, can be provided by mapping an access to the DIMM from a memory controller to semiconductor memory devices included in more than one rank within the multi-rank memory based on a mode register set signal and selectively linking rank control signals during a parallel bit test operation to the more than one rank within the multi-rank memory including the plurality of semiconductor memory devices.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 6 is a diagram illustrating a mapping table according to an embodiment of the inventive concept;

FIG. 7 is a diagram illustrating another mapping table according to an embodiment of the inventive concept;

DETAILED DESCRIPTION

Figure 1:
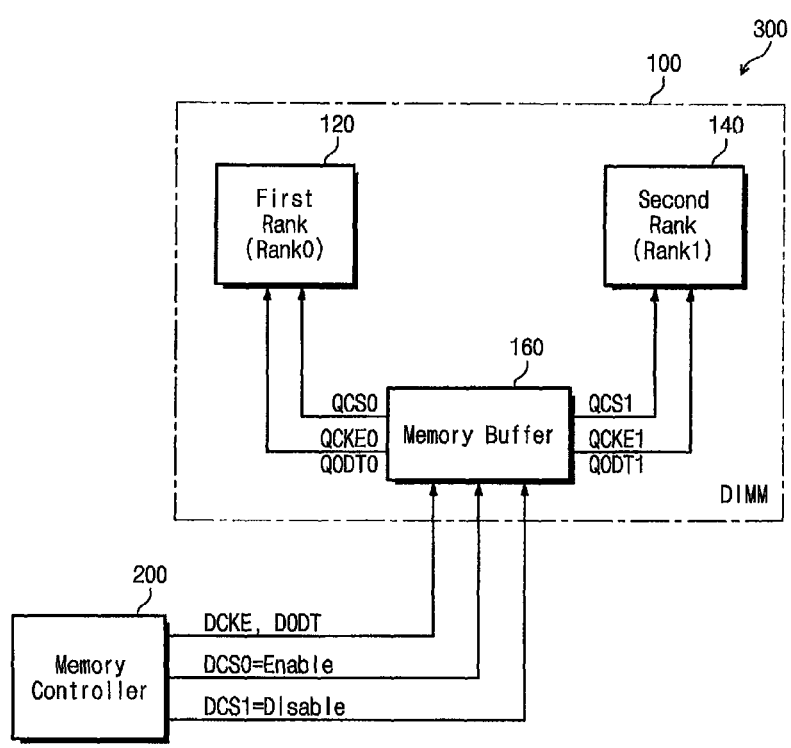
FIG. 1 is a block diagram illustrating a memory system according to an embodiment of the inventive concept.

The inventive concepts will now be described more fully hereinafter with reference to the accompanying drawings, in which exemplary embodiments of the inventive concepts are shown. The inventive concepts and methods of achieving them will be apparent from the following exemplary embodiments that will be described in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. Additionally, the embodiments in the detailed description are described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shapes illustrated in the exemplary views, but may include other shapes that may be created according to manufacturing processes.

Exemplary embodiments of aspects of the present inventive concepts explained and illustrated herein include their complementary counterparts. The same reference numerals or the same reference designators denote the same elements throughout the specification.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts.

The embodiments described herein and illustrated may be included and its complementary embodiments may also be included. Detailed descriptions regarding some circuits used to perform basic operations, such as in a read of in the volatile memory (e.g., DRAM) may not be described in detail herein so as not to obscure the subject matter of the present invention.

FIG. 1 is a block diagram illustrating a memory system according to an embodiment of the inventive concept;

Referring to FIG. 1, a memory system 300 may include a memory module 100 and a memory controller 200.

The memory controller 200 may be implemented with a processor, a host, or a system-on-a-chip (SOC). The memory controller 200 may transmit an address, control signals, or data to the memory module 100 and may receive read data received from the memory module 100.

The memory module 100 may include a plurality of semiconductor memory devices. The plurality of semiconductor memory devices may be mounted on a substrate, such as a printed circuit board (PCB), in the form of a dual in-line memory module (DIMM) and may include at least two ranks (i.e., a multi-rank memory module).

The memory module 100 may also change states of input signals for each rank based on a mapping table defined according to a mode register set (MRS) and may include a memory buffer 160 for controlling the memory devices for each rank.

For example, during a parallel bit operation mode, when an input rank control signal DCS0 for selecting the first rank 120 is received in an enable state from the memory controller 200 and an input rank control signal DSC1 for selecting a second rank 140 is received in a disable state therefrom, the memory buffer 160 may receive the input rank control signal DSC1 which makes it possible to simultaneously perform parallel bit tests with respect to the first and second ranks 120 and 140 and may output an output rank control signal QCS1 of an active state. Thus, the parallel bit tests about the first and second ranks 120 and 140 may be simultaneously performed in one memory module.

Input signals applied to the memory buffer 160 may include a clock enable signal DCKE or an on-die termination signal DODT which is provided for each rank as well as a rank control signal for selecting semiconductor memory devices for each rank.

During a parallel bit test operating mode, the memory buffer 160 may receive the input rank control signal DCS1 through a register control word (RCW) and may output the output rank signal OCS1 of an active state, and thus the parallel bit tests may be simultaneously performed with respect to the first and second ranks 120 and 140. In addition, since the memory buffer 160 performs a rank-based signal change function in which a state of the clock enable signal DCKE or a state of the on-die termination signal DODT provided for each rank is changed for each rank, the memory buffer 160 may control the input signals for each rank.

In FIG. 1, the memory buffer 160 may set states of signals QCS0, QCKE0, and QODT0 applied to the first rank 120 to an active state. Moreover, the memory buffer 160 may set states of the signals QCS1, QCKE1, and QODT1 applied to the second rank 140 to an active state.

Thus, when the parallel bit test operation about the semiconductor memory devices in the DIMM is performed, an inactive rank control signal (e.g., DCS1 in the case of FIG. 1) applied from the memory controller 200 may be changed into an active rank control signal based on a mapping table which the memory buffer 160 defines based on a mode register set signal. Thus, the parallel bit test operation may be simultaneously performed with respect to all the ranks, a state of the clock enable signal DCKE or a state of the on-die termination signal DODT provided for each rank may be controlled for each rank.

In FIG. 1, an embodiment of the inventive concept is exemplified as the semiconductor memory devices are implemented to have a dual rank structure. However, the scope and spirit of the inventive concept may not be limited thereto. For example, the semiconductor memory devices may be implemented to have a quad rank structure.

The memory module 100 may have a registered DIMM (RDIMM) or load reduced DIMM (RDIMM) structure. When the clock enable signal DCKE from the memory controller 200 is applied for each rank, the memory buffer 160 may change a state of the clock enable signal DCKE into an active or inactive state for each rank based on a mapping table.

In addition, when the on-die termination signal DODT is applied from the memory controller 200 for each rank, the memory buffer 160 may change a state of the on-die termination signal DODT into an active or inactive state for each rank based on the mapping table.

The memory module 100 of FIG. 1 may be connected to the memory controller 200 so as to constitute a high bandwidth memory system together with the memory controller 200.

Figure 2:
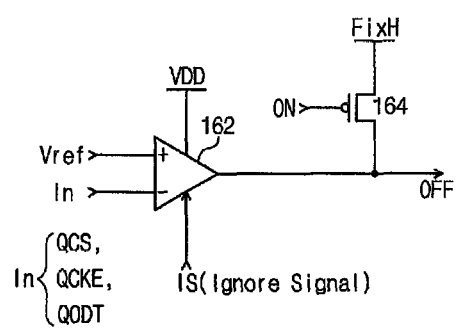
FIG. 2 is a diagram illustrating an example embodiment of an input circuit implemented with the memory buffer of FIG. 1.

FIG. 2 is a diagram illustrating an input circuit implemented with the memory buffer of FIG. 1, according to an embodiment of the inventive concept.

Referring to FIG. 2, the memory buffer 160 may include an input buffer 162 determining whether to receive and output the inactive rank control signal (e.g., DSC1 of FIG. 1) or whether to ignore the inactive rank control signal, and a switching unit 164 for fixing an output of the input buffer 162 to a high state or a low state.

For example, it may be assumed that the inactive rank control signal (e.g., DSC1 of FIG. 1) is applied as the input signal and a current mode is a parallel bit test mode. In this case, an ignore signal IS may be applied to the input buffer 162, thereby preventing the input buffer 162 from buffering the input signal. As a result, the input signal may be ignored. The ignore signal IS may be determined according to setting of the MRS signal for defining the mapping table. In addition, when the ignore signal IS is enabled, a switch-on signal ON of a low level may be provided to fix an output state of the input buffer 162 to a high level. In this case, a PMOS transistor 164 may be turned on, and thus an output of the input buffer 162 may be fixed to the high level. On the other hand, a switch-on signal ON of a high level may be provided to fix the output state of the input buffer 162 to a low level. In this case, when the PMOS transistor 164 is turned off and a discharge path is provided, the output of the input buffer 162 may be fixed to a low level. Thus, as well as a state of the rank control signal DCS, a state of the clock enable signal DCKE or a state of an on-die termination signal DODT may be changed.

Figure 3:
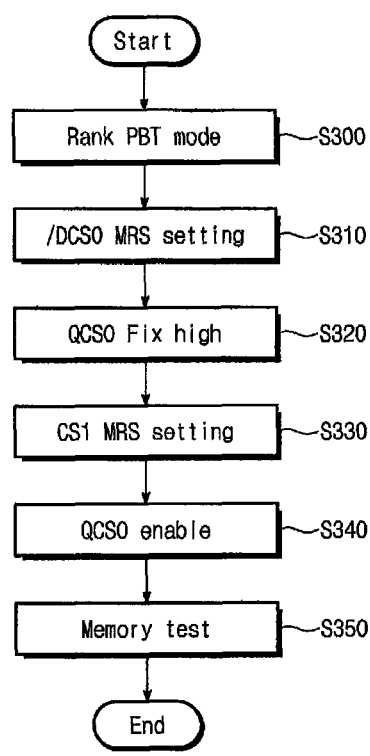
FIG. 3 is a block diagram illustrating a parallel bit test for each rank according to an embodiment of the inventive concept.

FIG. 3 is a block diagram illustrating a parallel bit test for each rank according to an embodiment of the inventive concept.

Referring to FIG. 3, in S300, the entering to a rank parallel bit test (PBT) mode may be performed. For example, when address bits A7 to A0 of "00000110" are provided as illustrated in a mapping table of FIG. 6, the entering to a rank parallel bit test (RPBT) mode in which a parallel bit test is simultaneously performed with respect to all ranks may be performed by a memory buffer 160.

In S310, a MRS setting operation about the first rank 120 may be performed. As a first input rank control signal/DCS0 is applied to the memory buffer 160, the first rank 120 may be selected based on the applied rank control signal. MRS setting of the DRAM about the parallel bit test performed with respect to the first rank 120 may be the same as that at a conventional parallel bit test. A variety of control and setting information provided for the parallel bit test operation may be set in the MRS setting process of the DRAM.

On the other hand, MRS setting about a second rank 140 of S330 may also be made to perform an RBPT according to an embodiment of the inventive concept. To this end, an operation of S320 (e.g., QCS0 is fixed to a high level) may be first performed to block a MRS input about the first rank 120. That is, since the MRS setting about the first rank 120 is already performed in S310, the MRS setting about the second rank 140 may refer to fixing of an output rank control signal QCS0 to a high state.

In S330, a MRS setting operation for the second rank 140 may be performed. An address at MRS setting about the first rank 120 may be mirrored to an address at MRS setting about the second rank 140. Thus, the address at MRS setting about the second rank 140 may be the mirrored address which is rearranged.

When the operation of S330 is completed, a state of an output rank control signal QCS0 of the first rank 120 fixed to a high at S340 may be changed to an enabled state. As a result, a state of the output rank control signal QCS0 may be restored to an original state.

After an operation of S340 is performed, an RPBT operation may be executed at S350. An RPBT may mean that all banks are tested at the same time when a parallel bit test is performed by a signal change function of the memory buffer 160.

The memory module may be implemented to enter the parallel bit test operation shown in FIG. 3 at a power-up sequence step.

Figure 4:
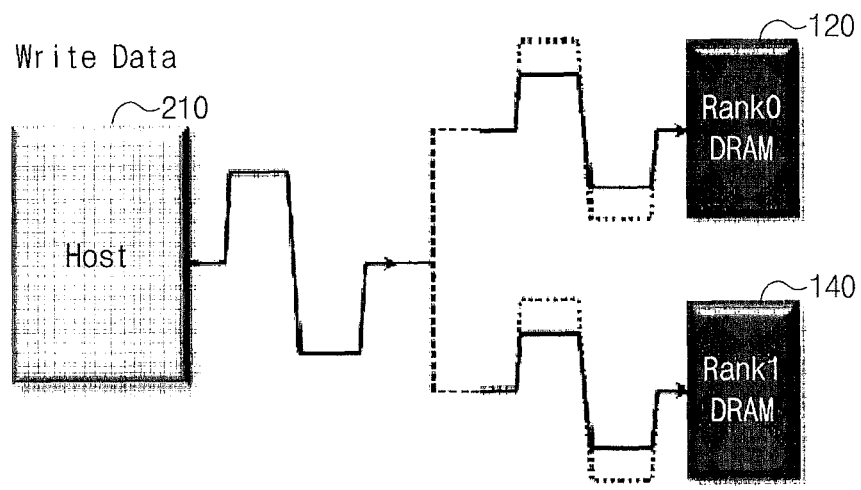
FIG. 4 is a diagram illustrating an example of a write operation for a parallel bit test according to an embodiment of the inventive concept.

FIG. 4 is a diagram illustrating an example of a write operation for parallel bit test according to an embodiment of the inventive concept.

Referring to FIG. 4, a memory system may include a host 210, the first rank 120, and the second rank 140.

The host 210 may correspond to the memory controller 200 of FIG. 1 or a parallel bit test device. During a RPBT, write data applied as test pattern data may be output from the host 210. In an embodiment of the inventive concept, the write data may be simultaneously applied to the first and second ranks 120 and 140 by a function of the memory buffer 160. When the write data is "1", the data "1" may be written at memory cells in the first and second ranks 120 and 140. On the other hand, when the write data is "0", the data "0" may be simultaneously written at memory cells in the first and second ranks 120.

As a result, according to an embodiment of the inventive concept, compared with a write operation performed with respect to one rank, a write operation may be simultaneously performed with respect to all ranks such as 2 ranks or 4 ranks, and thus the write operation time of the RBPT may be reduced.

Figure 5:
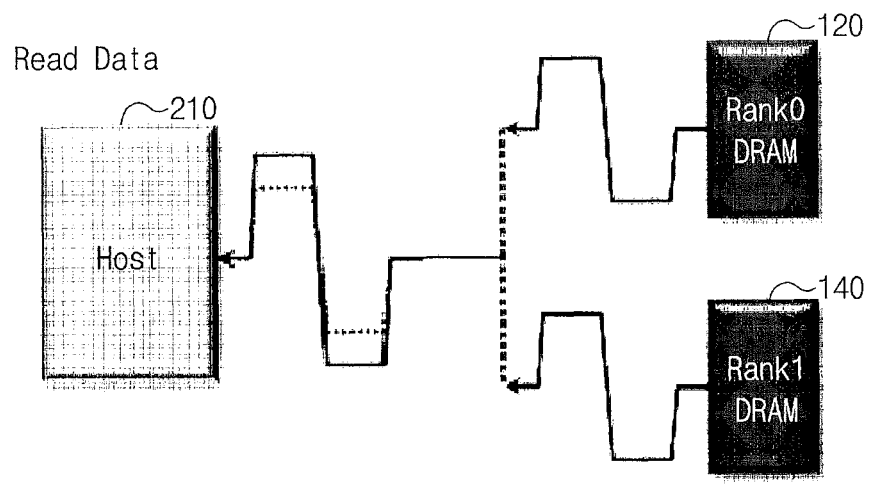
FIG. 5 is a diagram illustrating an example of a read operation for parallel bit test according to an embodiment of the inventive concept.

FIG. 5 is a diagram illustrating an example of read operation for parallel bit test according to an embodiment of the inventive concept.

Referring to FIG. 5, a memory system may include the host 210, the first rank 120, and the second rank 140.

The host 210 may correspond to the memory controller 200 of FIG. 1 or the parallel bit test device. During a RPBT, read data may be simultaneously outputted from the first and second ranks 120 and 140 by a function of the memory buffer 160.

Thus, the host 210 may compare read data of the first rank 120 with read data of the second rank 140 and may determine defects of the memory cells based on the compared result. In addition, the host 210 may perform a test operation between read data of the second rank 140 while the host 210 performs a test operation between read data of the first rank 120.

As a result, according to an embodiment of the inventive concept, compared with a bit test operation performed for each rank, a bit test operation may be simultaneously performed with respect to all ranks such as 2 ranks or 4 ranks, and thus the test operation time of the RBPT may be reduced.

FIG. 6 is a diagram illustrating a mapping table according to an embodiment of the inventive concept.

A register mapping table of the memory buffer 160 of FIG. 1 is illustrated in FIG. 6. For example, in a chip select signal CS, when address signals "A1A0" are "00", an operation may be controlled in a normal mode. On the other hand, when the address signals "A1A0" are "01", 4 ranks may be controlled as being 2 ranks. In addition, when the address signals "A1A0" are "10", 2 ranks may be controlled for each rank, or 4 ranks may be controlled for each rank. That is, as described with reference to FIG. 1, during an RPBT, 2 ranks may be operated as 1 rank for reducing test time.

Furthermore, in a clock enable signal CKE, when an address bit "A2" is "0", the operation control may be performed as a normal mode. On the other hand, when the address bit "A2" is "1", the memory buffer 160 may receive an input clock enable signal DCKE0 and may output a first rank clock enable signal QCKE0 of an active state and a second rank clock enable signal QCKE1 of an active state based on the received input clock enable signal DCKE0.

In an on-die termination signal ODT, when an address bit "A3" is "0", the operation control is performed as the normal mode. On the other hand, when an address bit "A3" is "1", the memory buffer 160 may receive an input on-die termination signal DODT0 and may output a first rank on-die termination signal QODT0 of an active state and a second rank on-die termination signal QODT1 of an active state based on the received input on-die termination signal DODT0. Thus, an on-die termination control may be performed for each rank.

On the other hand, when an address bit "A7" is "1", the memory buffer 160 may receive the input on-die termination signal DODT0 and may output the first rank on-die termination signal QODT0 of an active state based on the received input on-die termination signal DODT0, thereby fixing an output of the second rank on-die termination signal QODT1 to a high state.

FIG. 7 is a diagram illustrating another mapping table according to an embodiment of the inventive concept.

Another register mapping table of the memory buffer 160 of FIG. 1 is illustrated in FIG. 7. Mapping tables of FIGS. 6 and 7 may be accessed independently of each other based on an upper address bit.

In FIG. 7, in the first chip selection signal DCS0 mode for indicating the first rank control signal, when an address bit "A0" is "0", the input buffer may be enabled as a default. On the other hand, when the address bit "A0" is "1", an input of the input buffer of FIG. 2 may be ignored by a function of the memory buffer 160 and a state of the first rank control signal QCS0 may be fixed to a high level. Operation of S320 of FIG. 3 may be performed as the address bit "A0" becomes "1".

In addition, in the second chip selection signal DCS1 mode, when an address bit "A1" is "0", the input buffer may be enabled as a default. On the other hand, when the address bit "A0" is "1", the input of the input buffer of FIG. 2 may be ignored by a function (e.g., an ignore signal IS of FIG. 2) of the memory buffer 160 and a state of the second rank control signal QCS1 may be fixed to a high level.

On the other hand, in the first clock enable signal DCKE0 mode, when an address bit "A4" is "0", the input buffer may be enabled as a default. On the other hand, when the address bit "A4" is "1", the input of the input buffer of FIG. 2 may be ignored by the function of the memory buffer 160 and a state of the first clock enable signal QCKE0 may be fixed to a high level.

Comments of the mapping table described above may be only an example embodiment. However, the scope and spirit of the inventive concept may not be limited thereto.

Figure 8:
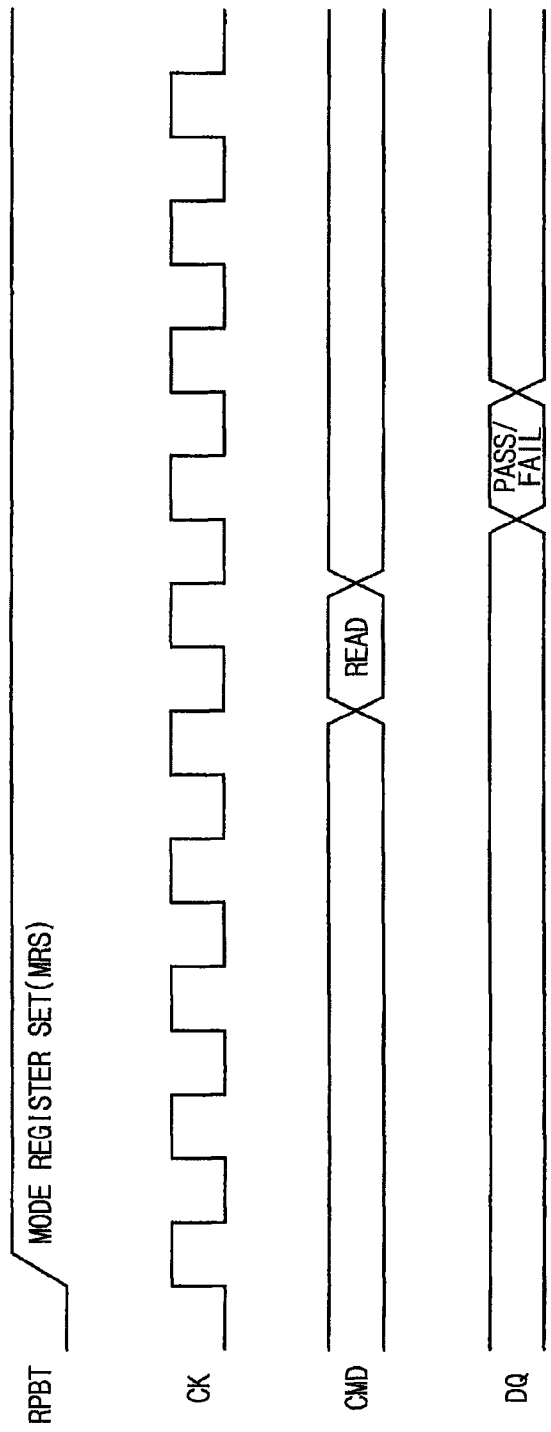
FIG. 8 is a timing diagram illustrating a parallel bit test operation according to an embodiment of the inventive concept.

FIG. 8 is a timing chart illustrating a parallel bit test operation for each rank according to an embodiment of the inventive concept.

Referring to FIG. 8, a rank PBT mode may be activated using a mode register set (MRS) signal (e.g., a code or word). In this case, write data as a predetermined test pattern may be written at the memory cells as described in FIG. 4. That is, data 1 or 0 as a test pattern may be simultaneously and/or concurrently written at memory cells of all the ranks.

When a read command READ CMD is applied in synchronization with a clock CK, PASS/FAIL may be outputted through a DQ pin as the result of comparing pieces of data read after a time.

Figure 9:
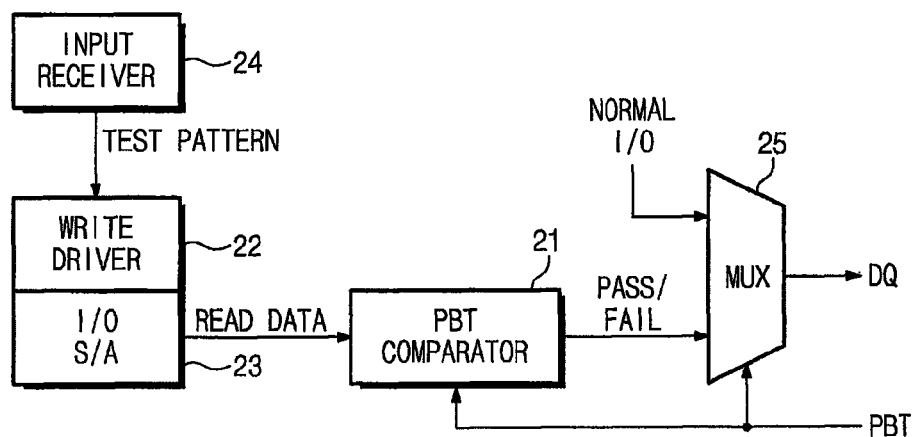
FIG. 9 is a diagram illustrating a read path circuit of a semiconductor memory device related to the rank parallel bit test of FIG. 8.

FIG. 9 is a diagram illustrating a read path circuit of a semiconductor memory device associated with a rank parallel bit test of FIG. 8.

Referring to FIG. 9, a read path circuit of a semiconductor memory device may include an input receiver 24, a write driver 22, an input/output sense amplifier (I/O S/A) 23, a PBT comparator 21, and a multiplexer (hereinafter referred to as "MUX") 25. After the PBT comparator 21 and the MUX 25 are activated by a rank parallel bit test (RPBT) active signal, the input receiver 24 may receive a test pattern and may transmit the received test pattern to the write driver 22. The write driver 22 may write the test pattern at the memory cells of all relevant ranks. After a time elapses, data recorded at the memory cells may be read through the input/output sense amplifier 23 based on a read command, and the read data may be applied to the PBT comparator 21. The PBT comparator 21 may perform rank PBT comparison with respect to the read data, and the comparison result (i.e., PASS/FAIL) may be output to the data pin DQ through the MUX 25.

In FIG. 9, the input/output sense amplifier 23 may be connected to bit line sense amplifiers connected to bit lines.

Each of memory cells arranged at intersections of bit lines and word lines may be a DRAM cell including an access transistor and a storage capacitor. The word lines may be enabled by decoding of row addresses and the bit lines BL may be selected by decoding of column addresses.

The row addresses may be decoded by a row decoder and a word line may be selected by the decoded row addresses. The column addresses may be decoded by a column decoder. The column decoder may decode the column addresses and may generate column selection signals for selecting a bit line based on the decoded column addresses. To support a burst length representing a maximum number of column locations to be accessed, bit lines (BLs) corresponding to the burst length may be accessed simultaneously.

When the burst length is set to '8', bit lines (BLs) may be connected to column selectors respectively connected to the column selection signals (CSL0 to CSL127) and eight bit lines BLs may be simultaneously selected by one column selector. Each of the column selectors may include eight switches that are turned on based on a corresponding column selection signal.

Figure 10:
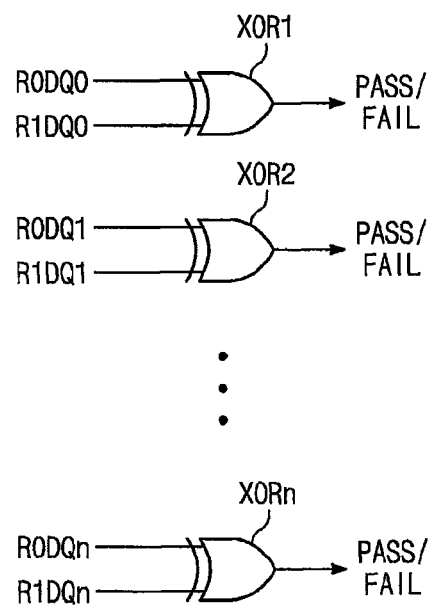
FIG. 10 is a diagram illustrating a comparison circuit of the parallel bit test comparator of FIG. 9.

FIG. 10 is a diagram illustrating a comparison circuit of the parallel bit test comparator of FIG. 9.

Referring to FIG. 10, a predetermined rank PBT comparison operation may be accomplished by comparing read data outputted from different ranks using an exclusive-OR gate. For example, an exclusive-OR gate XOR1 may receive 0th bit data R0DQ0 of the first rank and 0th bit data R1DQ0 of the second rank and may generate an exclusive-OR response based on the received two bit data R0DQ0 and R1DQ0. When a plurality of 0th bit data of the two ranks are all "0" or all "1", "0" may be output as pass data. When a plurality of 0th bit data of the two ranks are different from each other, "1" may be output as fail data.

Similarly, an exclusive-OR gate XOR 2 may receive first bit data R0DQ1 of the first rank and first bit data R1DQ1 of the second rank and may generate an exclusive-OR response based on the received two bit data R0DQ1 and R1DQ1. When pieces of first bit data of the two ranks all are "0" or "1", "0" may be output as pass data. On the other hand, when pieces of first bit data of the two ranks all are different from each other, "1" may be output as fail data.

Similarly, an exclusive-OR gate XORn may receive n-th bit data R0DQn of the first rank and n-th bit data R1DQn of the second rank and may generate an exclusive-OR response based on the received two n-th bit data. When pieces of n-th bit data of the two ranks all are "0" or "1", "0" may be output as pass data. On the other hand, when pieces of n-th bit data of the two ranks are different from each other, "1" may be output as fail data.

In this case, in memory module of a multi-rank structure, since parallel bit tests are simultaneously performed by a signal change function of the memory buffer, the test time may be reduced.

Figure 11:
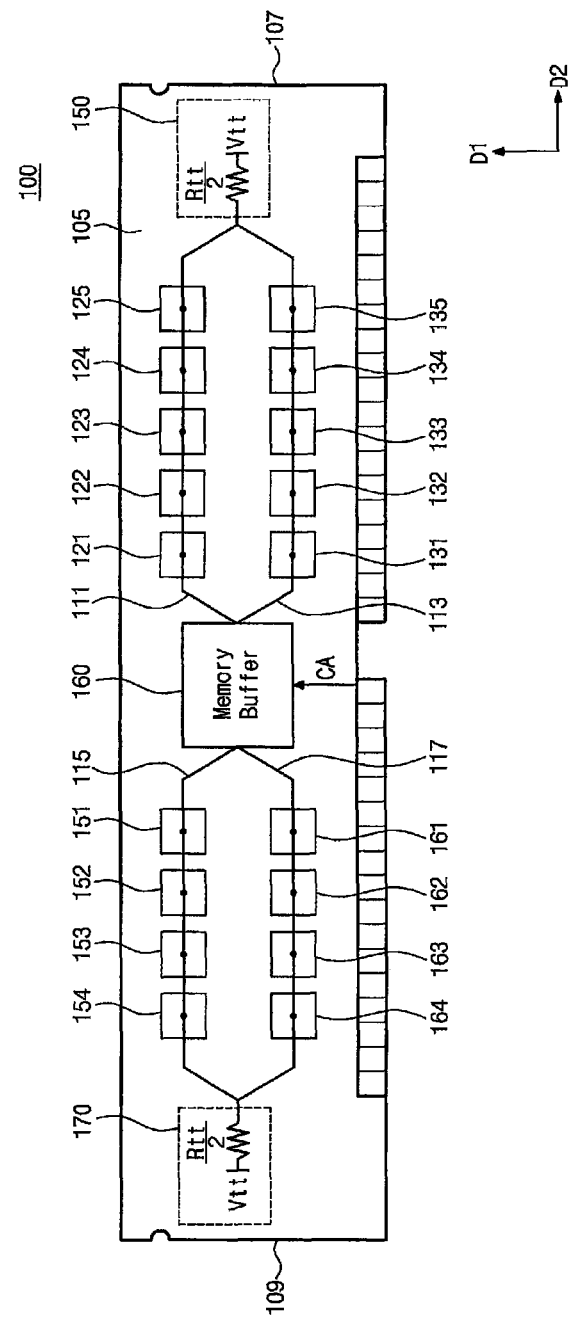
FIG. 11 is a diagram illustrating a DIMM layout according to an embodiment of the inventive concept.

FIG. 11 is a diagram illustrating a DIMM layout according to an embodiment of the inventive concept.

Referring to FIG. 11, a memory module 100 may include at least one memory buffer 160 disposed (or mounted) on a circuit board 105, a plurality of semiconductor memory devices 121 to 125, 131 to 135, 151 to 154, and 161 to 164, and module resistance units 150 and 170.

Here, the circuit board 105 which is a printed circuit board may extend to a second direction D2, perpendicular to a first direction D1, between a first edge portion 107 and a second edge portion 109 of the first direction D1. The at least one memory buffer 160 may be disposed on a center of the circuit board 105. The plurality of semiconductor memory devices 121 to 125, 131 to 135, 151 to 154, and 161 to 164 may be arranged in a plurality of rows between the memory buffer 160 and the first edge 107, and the plurality of semiconductor memory devices 121 to 125, 131 to 135, 151 to 154, and 161 to 164 may be arranged in a plurality of rows, between the memory buffer 160 and the second edge 109. In this case, the semiconductor memory devices 121 to 125 and 131 to 135 may be arranged along a plurality of rows between the memory buffer 160 and the first edge portion 107. The semiconductor memory devices 151 to 154 and 161 to 164 may be arranged along a plurality of rows between the memory buffer 160 and the second edge portion 109. A portion of the semiconductor memory devices 121 to 125 and 131 to 135 may be an error correction code (ECC) memory device.

The ECC memory device may perform an ECC encoding operation for generating parity bits about data to be written at the memory cells and an ECC decoding operation for correcting an error occurring in the data read from the memory cells.

For example, the ECC memory device may generate write parity bits by performing an XOR array operation about 64-bit write data [0:63] and bits of "b'00000000". Here, the bits of "b'00000000" may be used to generate write parity bits with regard to the 64-bit write data [0:63]. However, other particular bits may be used to generate parity bits with regard to the 64-bit write data [0:63], instead of the bits "b'00000000".

The memory buffer 160 may receive a command/address signal CA through a command/address transmission line from an external memory controller to function as a command/address register. Each of a plurality of semiconductor memory devices 121 to 125, 131 to 135, 151 to 154, and 161 to 164 may receive data through a data transmission line corresponding thereto.

The memory buffer 160 may provide a command/address signal to the semiconductor memory devices 121 to 125 through a command/address transmission line 111 and may provide a command/address signal to the semiconductor memory devices 131 to 135 through a command/address transmission line 113. In addition, the memory buffer 160 may provide a command/address signal to the semiconductor memory devices 151 to 154 through a command/address transmission line 115 and may provide a command/address signal to the semiconductor memory devices 161 to 164 through a command/address transmission line 117.

The command/address transmission lines 111 and 113 may be connected in common to a module resistance unit 150 disposed to be adjacent to the first edge portion 107, and the command/address transmission lines 115 and 117 may be connected in common to a module resistance unit 170 disposed to be adjacent to the second edge portion 109.

Each of the module resistance units 150 and 170 may include a termination resistor Rtt/2 connected to a termination voltage Vtt. In this case, an arrangement of the module resistance units 150 and 170 may reduce the number of the module resistance units, thereby reducing an area where termination resistors are occupied.

In FIG. 11, an embodiment of the inventive concept is exemplified as write data or read data does not pass through the memory buffer 160. However, the scope and spirit of the inventive concept may not be limited thereto. For example, the memory buffer 160 may interface the write data or the read data according to an embodiment of the inventive concept.

In addition, in FIG. 11, an embodiment of the inventive concept is exemplified as a layout about the semiconductor memory devices mounted on one surface of the circuit board. However, the scope and spirit of the inventive concept may not be limited thereto. For example, other semiconductor memory devices may be mounted on the other surface of the circuit board.

When a memory module of FIG. 11 has a multi-rank structure and enters a parallel bit test mode, the parallel bit test may be simultaneously performed by the above-described signal change function of the memory buffer 160 with respect to all ranks in one memory module, and thus a test parallel bit test time may be halved.

The memory buffer 160 may be connected to the semiconductor memory devices 121 to 125 and 131 to 135 in a fly-by ring topology and may also be connected to the semiconductor memory devices 151 to 154 and 161 to 164 in the fly-by ring topology.

In an embodiment, the memory module 100 may be a registered dual in-line memory module (RDIMM) or a load reduced dual in-line memory module (LRDIMM).

In addition, each of the semiconductor memory devices 121 to 125, 131 to 135, 151 to 154, 161 to 164 may be a DDR4 DRAM.

In addition, the semiconductor memory devices 121 to 125, 131 to 135, 151 to 154, and 161 to 164 which belong to the same rank may be activated by a rank control signal as the same chip select signal CS during a normal operation. The semiconductor memory devices 121 to 125, 131 to 135, 151 to 154, and 161 to 164 which belong to different ranks may be activated by different rank control signals during a normal operation.

On the other hand, the semiconductor memory devices may constitute a stacked memory device where each of memory dies communicates data and control signals through a plurality of through-silicon lines.

Figure 12:
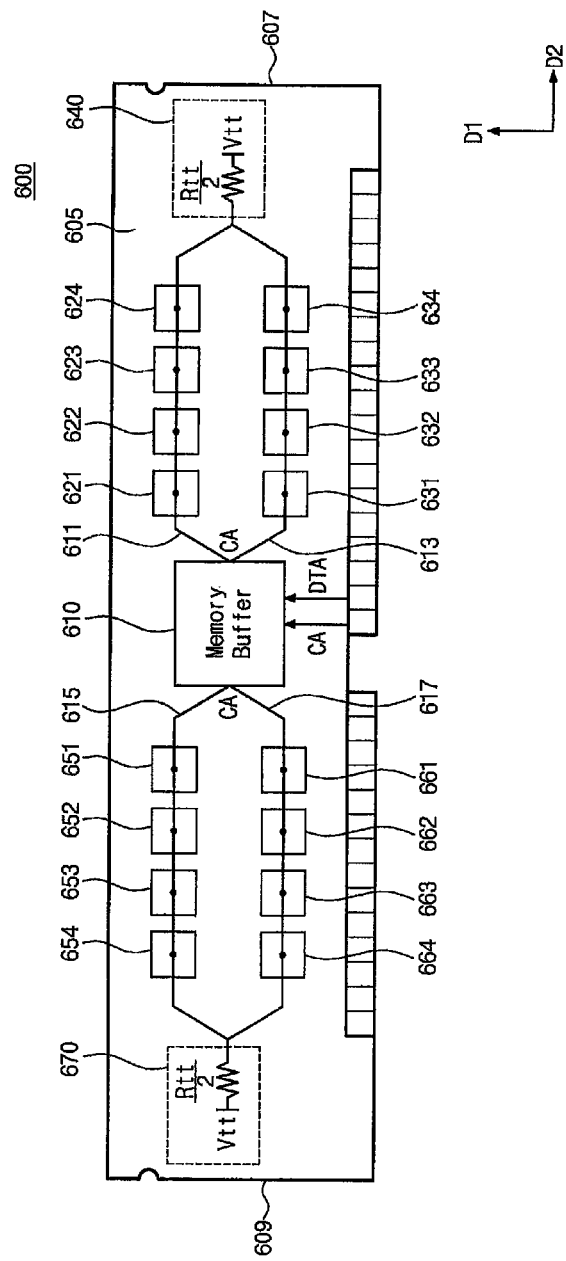
FIG. 12 is an example diagram illustrating another DIMM layout according to an embodiment of the inventive concept.

FIG. 12 is a diagram illustrating a DIMM layout according to another embodiment of the inventive concept.

Referring to FIG. 12, the memory module 600 may include a memory buffer 610, a plurality of semiconductor memory devices 621 to 624, 631 to 634, 651 to 654, 661 to 664, and module resistance units 640 and 670 arranged on the circuit board 605.

In this case, the circuit board 605 may extend to a second direction D2, perpendicular to a first direction D1, between a first edge portion 607 and a second edge portion 609 of the first direction D1. A memory buffer 610 as a hub 610 may be disposed at a center portion of the circuit board 605, and a plurality of semiconductor memory devices 621 to 624, 631 to 634, 651 to 654, and 661 to 664 may be disposed in a plurality of rows along the second direction D2, between the memory buffer 610 and the first edge portion 607, and between the memory buffer 610 and the second edge portion 609.

The memory buffer 610 which buffers a command/address CA and data DTA received from an external memory controller through a plurality of transmission lines may provide the buffered command/address CA and data DTA to the semiconductor memory devices 621 to 624, 631 to 634, 651 to 654, and 661 to 664.

The memory buffer 610 may provide a command/address signal to the semiconductor memory devices 621 to 624 through a command/address transmission line 611 and may provide a command/address signal to the semiconductor memory devices 631 to 634 through a command/address transmission line 613. The memory buffer 610 may provide a command/address signal to the semiconductor memory devices 651 to 654 through a command/address transmission line 615 and may provide a command/address signal to the semiconductor memory devices 661 to 664 through a command/address transmission line 617.

The command/address transmission lines 611 and 613 may be connected in common to a module resistance unit 640 disposed adjacent to the first edge portion 607, and the command/address transmission lines 615 and 617 may be connected in common to a module resistance unit 670 disposed adjacent to the second edge portion 609.

Each of the module resistance units 640 and 670 may include a termination resistor Rtt/2 connected to a termination voltage Vtt. In this case, an arrangement of the module resistance units 640 and 670 may reduce the number of the module resistance units, thereby reducing an area where termination resistors are occupied.

In FIG. 12, write data may be provided to the semiconductor memory devices via the memory buffer 610, or read data read from the semiconductor memory devices may be output to the memory controller via the memory buffer 610.

In addition, in FIG. 12, a layout about the semiconductor memory devices mounted on one surface of the circuit board is described. However, other semiconductor memory devices may be mounted on the other surface of the circuit board.

When a memory module of FIG. 12 is a multi-rank structure and enters a parallel bit test mode, the parallel bit tests about all ranks in one memory module may be simultaneously performed by a signal change function for each rank of the memory buffer 610 as described above. Thus, the parallel bit test time may be reduced by a half.

The memory buffer 610 may be connected to the semiconductor memory devices 621 to 624 and 631 to 634 in a fly-by ring topology and may also be connected to the semiconductor memory devices 651 to 654 and 661 to 664 in the fly-by ring topology.

In an embodiment, the memory module 600 may be a registered dual in-line memory module (RDIMM) or a load reduced dual in-line memory module (LRDIMM).

In addition, each of the semiconductor memory devices 621 to 624, 631 to 634, 651 to 654, 661 to 664 may be a DDR4-DRAM.

In addition, the semiconductor memory devices 621 to 624, 631 to 634, 651 to 654, and 661 to 664 which belong to the same rank may be activated by a rank control signal as the same chip select signal CS during a normal operation. The semiconductor memory devices 121 to 125, 131 to 135, 151 to 154, and 161 to 164 which belong to different ranks may be activated by different rank control signals during a normal operation.

Figure 13:
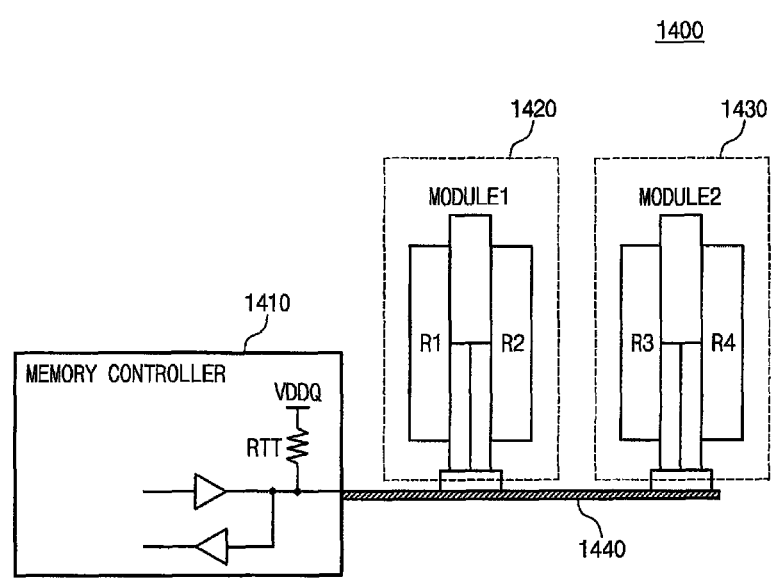
FIG. 13 is a block diagram illustrating a memory system having quad rank memory modules according to an embodiment of the inventive concept.

FIG. 13 is a block diagram illustrating a memory system having quad-rank memory modules according to an embodiment of the inventive concept.

Referring to FIG. 13, a memory system 1400 may include a memory controller 1410 and at least one or more memory modules 1420 and 1430.

The memory controller 1410 may control a memory module so as to perform a command supplied from a processor or host. The memory controller 1410 implemented in a processor or host may be implemented with an application processor or a system-on-a-chip (SOC). For signal integrity, a source termination may be implemented with a resistor RTT on a bus 1440 of the memory controller 1410.

The first memory module 1420 and the second memory module 1430 may be coupled to the memory controller 1410 through the bus 1440. Each of the first memory module 1420 and the second memory modules 1430 may be the memory module 100 or 600 of FIG. 11 or 12.

The first memory module 1420 may include at least one or more memory ranks R1 and R2, and the second memory module 1430 may include one or more memory ranks R3 and R4.

In an embodiment, the memory ranks R1, R2, R3 and R4 may be connected in a multi-drop manner to transmit and receive data and/or address signal through the same transmission line. The memory ranks R1, R2, R3 and R4 may be arranged in a plurality of rows, respectively (i.e., the semiconductor memory devices contained in the memory ranks, respectively) and may be connected to at least one command/address register in a fly-by ring topology or a fly-by daisy-chain topology. Each of the memory ranks R1, R2, R3 and R4 may be terminated by at least one module resistance unit which provides a termination resistor Rtt/2.

In a memory module of FIG. 13, since a parallel bit test is simultaneously performed by the above-described signal change function of the memory buffer mounted on the memory module with respect to all ranks, the test time may be reduced.

In FIG. 13, an embodiment of the inventive concept is exemplified as a memory module which includes semiconductor memory devices implemented with DRAMs. However, the scope and spirit of the inventive concept may not be limited thereto FIG. 14 is a block diagram illustrating an application applied to a computing system according to an embodiment of the inventive concept.

Figure 14:
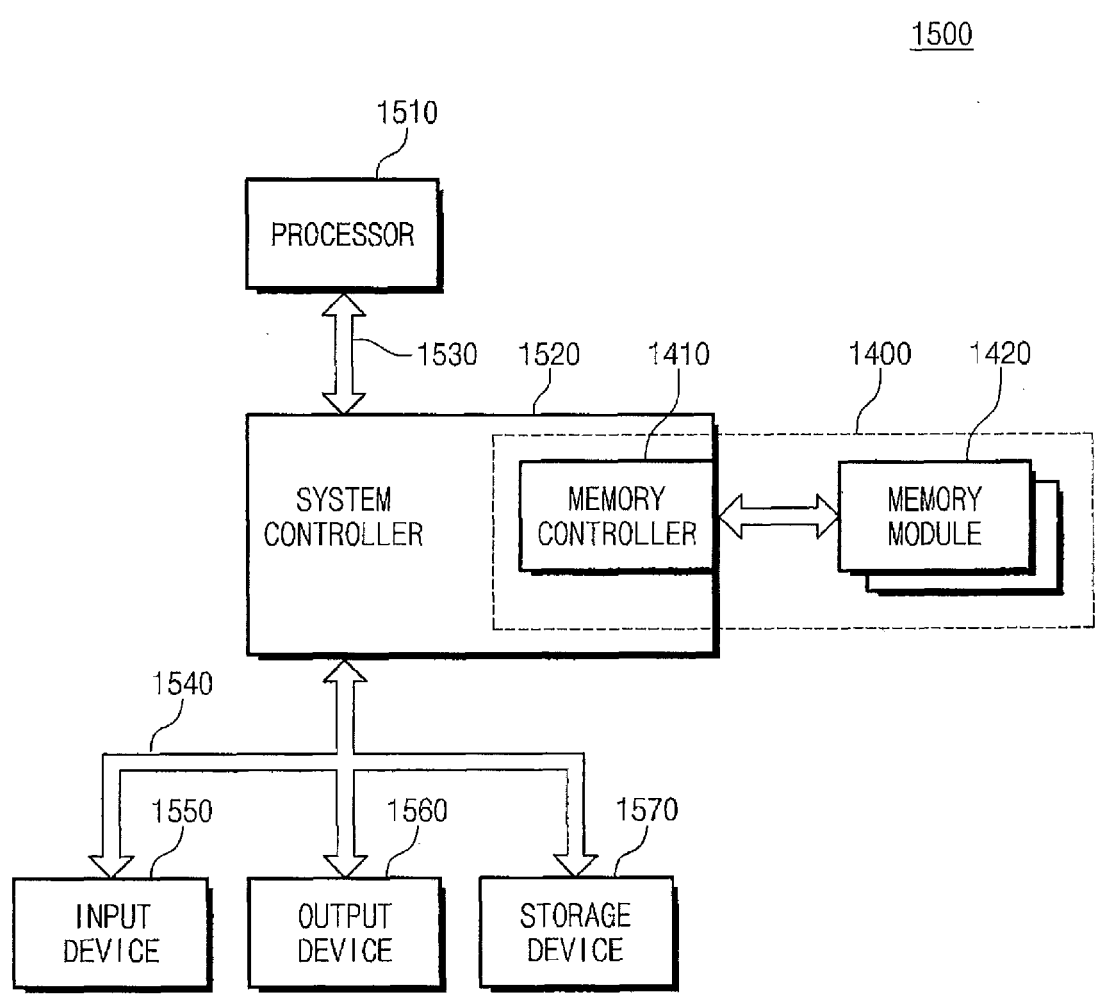
FIG. 14 is a block diagram illustrating an application example applied to a computing system according to an embodiment of the inventive concept.

Referring to FIG. 14, a computing system 1500 may include a processor 1510, a system controller 1520, and a memory system 1400.

The computing system 1500 may further include a processor bus 1530, an expansion bus 1540, an input device 1550, an output device 1560, and a storage device 1570. The memory system 1400 may include at least one memory module 1420 and a memory controller 1410. The memory controller 1410 may be included in a system controller 1520.

The processor 1510 may execute various computing functions such as executing specific software which executes specific calculations or tasks. For example, the processor 1510 may be a microprocessor or a central processing unit. The processor 1510 may be coupled to the system controller 1520 through the processor bus 1530 including an address bus, a control bus and/or a data bus.

A host interface between the processor 1510 and the system controller 1520 may include a variety of protocols for performing data exchange. In an example embodiment, the system controller 1520 may be configured to communicate with the host or the outside through at least one of a variety of interface protocols such as universal serial bus (USB), multimedia card (MMC), peripheral component interconnection (PCI), PCI-express (PCI-E), advanced technology attachment (ATA), serial-ATA, parallel-ATA, small computer small interface (SCSI), enhanced small disk interface (ESDI), and integrated drive electronics (IDE) protocols, and the like.

The system controller 1520 may be connected to the expansion bus 1540 such as a peripheral component interconnection (PCI). In this case, the processor 1510 may control one or more input devices such as a keyboard or a mouse through a system controller 1520, one or more output devices 1560 such as a printer or a display device, one or more storage devices 1570 such as a hard disk drive (HDD), a solid storage device (SSD), or a CD-ROM.

A display element as one of the output devices 1560 may be implemented with a thin film transistor liquid crystal display (TFT-LCD), a light-emitting diode (LED) display, an organic LED (OLED) display, an active-matrix OLED (AMOLED) display, or a flexible display.

The memory controller 1410 may control the memory module 1420 to perform a command provided by the processor 1510. The memory module 1420 may store data supplied from the memory controller 1410 and may provide the stored data to the memory controller 1410.

The memory module 1420 may include a plurality of semiconductor memory devices, for example, a volatile memory including a dynamic random access memory (DRAM) and a static random access memory (SRAM), or a nonvolatile memory.

The volatile memory may include a dynamic random access memory (DRAM), a static random access memory (SRAM), a thyristor RAM (TRAM), a zero capacitor RAM (Z-RAM), a twin transistor RAM (TTRAM), or MRAM.

The nonvolatile memory may be an electrically erasable programmable read-only memory (EEPROM), a flash memory, a magnetic RAM (MRAM), a spin-transfer torque MRAM (STT-MRAM), a conductive bridging RAM (CBRAM), a ferroelectric RAM (FeRAM), a phase change RAM (PRAM), a resistive RAM (RRAM), a nanotube RRAM (RRAM), a polymer RAM (PoRAM), a nano-floating gate memory (NFGM), a holographic memory, a molecular electronic memory device, or an insulator resistance change memory. One or more bits may be stored in a unit cell of the nonvolatile memory.

In FIG. 14, since a parallel bit test is simultaneously performed by the above-described signal change function of the memory buffer mounted on a memory module with respect to all ranks, the implementation cost of a computing system may be reduced by the improvement of the price competitiveness of the memory module.

The computing system may be changed or extended into one of various components of electronic devices such as a ultra-mobile PC (UMPC), a workstation, a net-book, a personal digital assistants (PDA), or the like.

According to an embodiment of the inventive concept, in a memory module of a multi-rank structure, parallel bit test time may be reduced by a signal change function of the memory buffer for each rank.

As described above, an embodiment is disclosed by the drawings and specifications. In this case, the terminology used herein is for the purpose of describing particular embodiments only and is not intended to limit the invention. Therefore, it may be understood that various modifications and other equivalent embodiments are possible from this point one of ordinary skill in the art.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed:

1. A memory module, comprising:
   a plurality of semiconductor memory devices on a substrate to provide a DIMM organized into at least two ranks; and
   a memory buffer configured to change states of input signals received for each rank based on a mapping table defined according to a mode register set signal and configured to control the plurality of semiconductor memory devices for each rank.

2. The memory module of claim 1, wherein the input signals include a rank control signal configured to select the semiconductor memory devices for each rank.

3. The memory module of claim 1, wherein the input signals include clock enable signals for each rank.

4. The memory module of claim 1, wherein the input signals include on-die termination signals for each rank.

5. The memory module of claim 1, wherein the semiconductor memory devices provide a stacked memory device configured to communicate data and control signals through a plurality of through-silicon lines.

6. A method of operating a memory module including a plurality of semiconductor memory devices organized into a multi-rank memory on a DIMM and a memory buffer included on the DIMM, operatively coupled to the multi-rank memory, the method comprising:
   mapping an access to the DIMM from a memory controller to semiconductor memory devices included in more than one rank within the multi-rank memory based on a mode register set signal; and
   selectively linking rank control signals during a parallel bit test operation to the more than one rank within the multi-rank memory including the plurality of semiconductor memory devices.

7. The method of claim 6 wherein selectively linking rank control signals during the parallel bit test operation comprises changing a rank control signal received from the memory controller from inactive to active based on the mapping so that at least two rank control signals are enabled during the parallel bit test operation.

8. The method of claim 6 wherein selectively linking rank control signals during the parallel bit test operation comprises:
   changing a state of a clock enable signal to active or inactive for each rank within the multi-rank memory when the clock enable signal is transmitted from the memory controller for each rank based on the mapping.

9. The method of claim 6 wherein each of the plurality of semiconductor memory devices is a double data rate DRAM.

10. The method of claim 6 wherein selectively linking rank control signals during a parallel bit test operation comprises simultaneously performing the parallel bit test operation during a power-up sequence of the memory module.

11. The method of claim 6 further comprising:
un-linking the rank control signals outside a power-up sequence of the memory module.

* * * * *